(12) United States Patent
Petz et al.

(10) Patent No.: US 11,018,298 B2
(45) Date of Patent: May 25, 2021

(54) PHASE CHANGE MEMORY STRUCTURES

(71) Applicant: Intel Corporation, Santa Clara, CA (US)

(72) Inventors: Christopher W. Petz, Boise, ID (US); David R. Economy, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/619,040

(22) PCT Filed: Jul. 1, 2017

(86) PCT No.: PCT/US2017/040555
§ 371 (c)(1),
(2) Date: Dec. 3, 2019

(87) PCT Pub. No.: WO2019/009876
PCT Pub. Date: Jan. 10, 2019

(65) Prior Publication Data
US 2020/0119270 A1    Apr. 16, 2020

(51) Int. Cl.
*H01L 45/00* (2006.01)
*H01L 27/24* (2006.01)
(52) U.S. Cl.
CPC ...... *H01L 45/1253* (2013.01); *H01L 27/2409* (2013.01); *H01L 45/06* (2013.01); *H01L 45/1233* (2013.01); *H01L 45/141* (2013.01); *H01L 45/1608* (2013.01)

(58) Field of Classification Search
CPC ............... H01L 45/1253; H01L 45/106; H01L 45/1233; H01L 45/141; H01L 45/1608; H01L 27/2409
USPC .......................................................... 257/4
See application file for complete search history.

(56) References Cited

U.S. PATENT DOCUMENTS

| 9,985,204 B2 * | 5/2018 | Lee ..................... H01L 45/143 |
| 2005/0002227 A1 | 1/2005 | Hideki et al. |
| 2008/0068879 A1 | 3/2008 | Alin et al. |
| 2008/0078984 A1 | 4/2008 | Park et al. |
| 2011/0193048 A1 | 8/2011 | Oh et al. |

OTHER PUBLICATIONS

PCT Application No. PCT/US2017/040555 Filing date Jul. 1, 2017, Christopher W. Petz International Search Report dated Mar. 15, 2018, 9 Pages.

* cited by examiner

*Primary Examiner* — Tu-Tu V Ho
(74) *Attorney, Agent, or Firm* — Alliance IP, LLC

(57) ABSTRACT

A phase change memory structure (100) includes a phase change material layer (110), a top electrode layer (120) above the phase change material layer, a metal silicon nitride layer (130) in contact with the top electrode layer opposite from the phase change material layer, a metal silicide layer (140) in contact with the metal silicon nitride layer opposite from the top electrode layer, and a conductive metal bit line (150) in contact with the metal silicide layer opposite from the metal silicon nitride layer.

25 Claims, 7 Drawing Sheets

PHASE CHANGE MEMORY STRUCTURES

PRIORITY INFORMATION

This application is a 371 U.S. national stage entry of PCT Application Serial No. PCT/US2017/040555, filed Jul. 1, 2017, which is incorporated herein by reference in its entirety.

BACKGROUND

Phase change materials have properties that invite their use in a number of applications such as ovonic threshold switches and phase change memory (PCM).

Different physical states of the phase change material have different levels of electrical resistance. For example, one state, such as an amorphous state, can have a high electrical resistance, while another state, such as a crystalline state, can have a low electrical resistance. In PCM, these different levels of electrical resistance can be used to store binary information. Each state is assigned a different binary value, and once stored, information can be read by detecting the electrical resistance of the material. The fact that each state persists once fixed makes PCM a valuable non-volatile memory (NVM) type.

DESCRIPTION OF EMBODIMENTS

Figure 1:
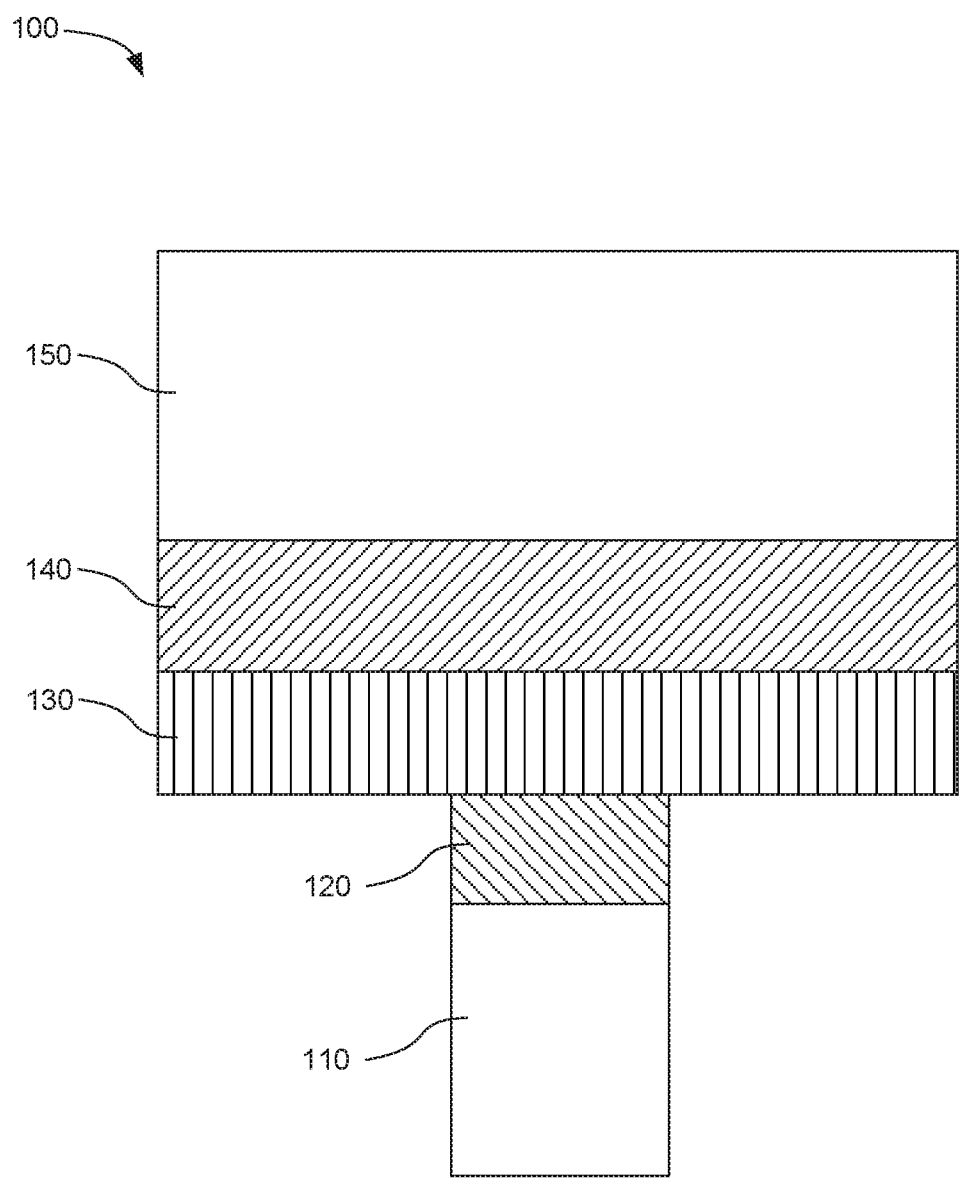
FIG. 1 is a cross-sectional view of an example phase change memory structure in accordance with an example embodiment.

Although the following detailed description contains many specifics for the purpose of illustration, a person of ordinary skill in the art will appreciate that many variations and alterations to the following details can be made and are considered included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

As used herein, "enhanced," "improved," "performance-enhanced," "upgraded," and the like, when used in connection with the description of a device or process, refers to a characteristic of the device or process that provides measurably better form or function as compared to previously known devices or processes. This applies to both the form and function of individual components in a device or process, as well as to such devices or processes as a whole.

As used herein, "coupled" refers to a relationship of physical connection or attachment between one item and another item, and includes relationships of either direct or indirect connection or attachment. Any number of items can be coupled, such as materials, components, structures, layers, devices, objects, etc.

As used herein, "directly coupled" refers to a relationship of physical connection or attachment between one item and another item where the items have at least one point of direct physical contact or otherwise touch one another. For example, when one layer of material is deposited on or against another layer of material, the layers can be said to be directly coupled.

Objects or structures described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

EXAMPLE EMBODIMENTS

An initial overview of technology embodiments is provided below and specific technology embodiments are then described in further detail. This initial summary is intended to aid readers in understanding the technology more quickly, but is not intended to identify key or essential technological features, nor is it intended to limit the scope of the claimed subject matter.

In certain phase change memory technologies, an array of memory cells can be connected to bit lines and word lines. The bit lines are oriented along columns of memory cells and the word lines are oriented along rows of memory cells to allow each memory cell to be individually addressable. In some specific phase change memory technologies, the memory cells can each include a phase change material, a top electrode layer, and a metal silicon nitride layer over the top electrode layer. A metal bit line is then deposited over the top of the metal silicon nitride layer.

In some cases, manufacturing such memory arrays can present various challenges. It has been found that in some cases compressive residual stresses are present in the top electrode layer and the metal silicon nitride layer after formation of the memory array. The compressive residual stress can exert force on the metal bit line that tends to cause the metal bit line to warp and bend. Bit lines for neighboring columns of memory cells can be quite close together. Thus, in some cases bending of the bit lines can cause neighboring bit lines to touch, creating a short between the bit lines. Accordingly, it can be desirable to keep the bit lines as straight as possible to avoid bit line shorting.

In order to combat bit line bending, the metal bit line can be deposited in such a way that the metal bit line has residual tensile stress to counteract the compressive stress in the underlying metal silicon nitride and top electrode layers. In some example, the metal bit line can be deposited by a method such as physical vapor deposition (PVD) or chemical vapor deposition (CVD). Various parameters can be adjusted during the deposition process to change the tensile stress present in the metal bit line. In one example, these parameters can include bias power and argon partial pressure during the deposition process. These parameters can be optimized to maximize the tensile stress in the metal bit line in order to counteract the compressive stress in the underlying layers. However, in some cases adjusting the parameters to increase the tensile stress in the metal bit line can have the undesired effect of increasing the electrical resistivity of the metal bit line. In some cases, this can also increase the roughness of the metal bit line. Both of these effects can degrade performance of the memory array. Therefore, in many cases only a modest amount of tensile stress can be added to the metal bit line before the resistivity and roughness of the metal bit line increase to unsuitable levels.

The technology described herein can solve these problems by increasing the tensile stress in the metal bit line without increasing the resistivity and roughness of the metal bit line. In some examples of the present technology, memory cells can include a phase change material layer, a top electrode layer above the phase change material layer, a metal silicon nitride layer deposited over the top electrode layer, a metal silicide layer deposited over the metal silicon nitride layer, and a metal bit line deposited over the metal silicide layer. It has been found that adding a metal silicide layer between the metal silicon nitride layer and the metal bit line can cause the metal bit line to have increased tensile stress compared to a metal bit line deposited directly over a metal silicon nitride layer. Accordingly, the metal bit line can have sufficient tensile stress to reduce bit line bending without the need of adjusting the bit line deposition parameters to the point that the resistivity and roughness become unsuitably high.

FIG. 1 shows a cross-sectional view of a phase change memory structure 100 in accordance with an example of the present technology. The phase change memory structure includes a phase change material layer 110. A top electrode layer 120 is deposited above the phase change material layer. A metal silicon nitride layer 130 is deposited in contact with the top electrode layer, and opposite from the phase change material layer. A metal silicide layer 140 is then deposited in contact with the metal silicon nitride layer opposite from the top electrode layer. A conductive metal bit line 150 is deposited in contact with the metal silicide layer opposite from the metal silicon nitride layer.

In some examples, the metal used in the conductive metal bit line, metal silicide layer, and metal silicon nitride layer can be the same type of metal. In other examples, different metals can be used in the different layers. In one particular example, tungsten can be the metal in each of these layers. Thus, the metal silicon nitride layer can include tungsten silicon nitride (WSiN), the metal silicide layer can include tungsten silicide (WSi$_x$), and the conductive metal bit line can be made of tungsten (W). A variety of other metals can also be used in the phase change memory structure. In certain specific examples, the metal can be tungsten, tantalum, niobium, molybdenum, titanium, or a combination thereof. In further examples, the metal in each layer can consist of one of these metals.

In other specific examples, the metal silicon nitride layer can include or consist of tungsten silicon nitride, tantalum silicon nitride, niobium silicon nitride, molybdenum silicon nitride, titanium silicon nitride, or a combination thereof.

In further specific examples, the metal silicide layer can include or consist of tungsten silicide, tantalum silicide, niobium silicide, molybdenum silicide, titanium silicide, or a combination thereof.

In still further specific examples, the conductive metal bit line can include or consist of tungsten, tantalum, niobium, molybdenum, titanium, or a combination thereof.

As used herein, "metal silicon nitride" describes materials formed of a metal, silicon, and nitride. This term does not limit the material to any specific stoichiometric proportions of metal, silicon, and nitrogen atoms in the material. Similarly, "metal silicide" refers to materials formed of metal and silicon atoms, but does not limit the stoichiometry of the metal and silicon atoms. Acronyms used to describe specific materials herein, such as "WSiN" and "WSi$_x$" are not intended to limit the material to any particular stoichiometric ratios of the atoms in the material. In some particular examples, the metal silicide layer can be formed of WSi$_x$, where x is from 1 to 3.

The thicknesses of the layers are not particularly limited. However, in some examples the metal silicon nitride layer and metal silicide layer can independently have a thickness of 10 Å to 300 Å. In further examples, the metal silicon nitride layer and metal silicide layer can have a thickness of 20 Å to 100 Å. In other examples, the top electrode layer can have a thickness of 10 Å to 500 Å. In further examples, the top electrode layer can have a thickness of 20 Å to 200 Å. In still further examples, the conductive metal bit line can have a thickness of 100 Å to 1000 Å. It should be noted that the layer thicknesses, lengths, and widths shown in the figures are not necessarily drawn to scale.

In certain examples, the phase change memory structures described herein can include additional layers not shown in FIG. 1. These additional layers can include, but are not limited to, additional electrode layers, diffusion barrier layers, select device material layers, conductive word line layers, and so on.

As a general matter, the phase change material can include any useful material having a stable and detectable change in phase. Examples of such a materials include any of a variety of chalcogenide alloys, including, without limitation, Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Pd, and Ge—Te—Sn—Pt, among others. The hyphenated chemical composition notation, as used herein, indicates the elements included in a particular mixture or compound, e.g., chalcogenide alloy, and is intended to represent all stoichiometries involving the indicated elements, e.g., Ge$_X$Sb$_Y$Te$_Z$ having variations in stoichiometries, such as Ge$_2$Sb$_2$Te$_5$, Ge$_2$Sb$_2$Te$_7$, Ge$_1$Sb$_2$Te$_4$, Ge$_1$Sb$_4$Te$_7$, etc., to form a gradient.

It is noted that the select device material is generally made of a phase change material, and as such, the above exemplary chalcogenide materials are applicable as well. The actual chalcogenide material used in a given memory structure for the phase change material layer and the select device material layer can be different or the same, depending on the design of the device. In another example, the select device material can be a conductor, semiconductor, or dielectric material. Such materials can be selected as needed to perform an intended function in the phase change memory structure.

The top electrode layer and/or other electrode layers in the phase change memory structure can be formed of conductive materials. In some examples, the electrode layers can include carbon-containing materials. Specific, non-limiting examples of electrode materials can include amorphous carbon, amorphous carbon doped with silicon, and silicon carbide doped with tungsten.

Figure 2:
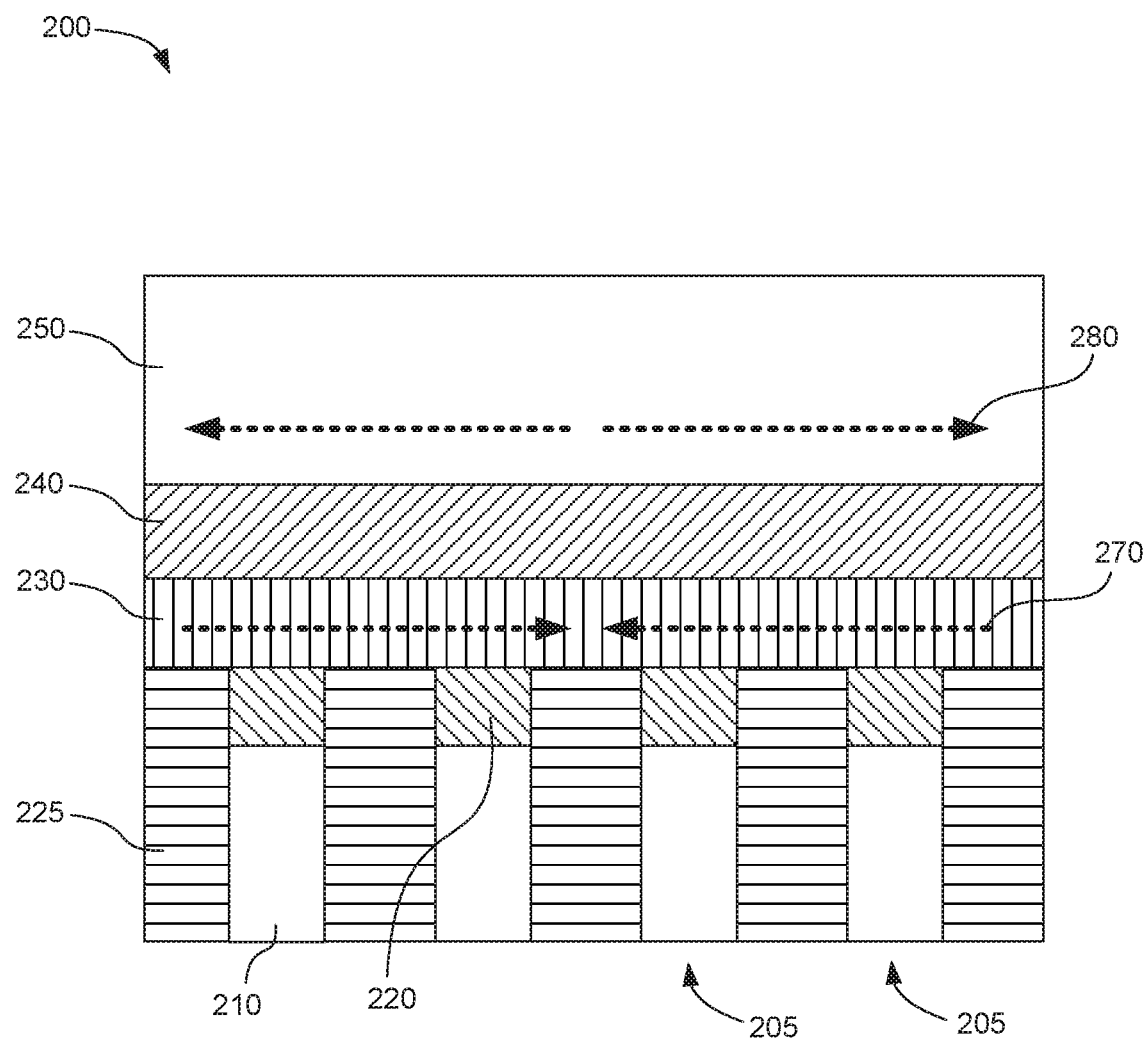
FIG. 2 is a cross-sectional view of an example phase change memory structure in accordance with an example embodiment.

FIG. 2 shows a cross-sectional view of another example phase change memory structure 200. This phase change memory structure includes a plurality of memory cells 205. Each memory cell includes a phase change material layer 210 and a top electrode layer 220 above the phase change material layer. A dielectric material 225 electrically insulates the memory cells one from another. A metal silicon nitride layer 230 is in contact with the top electrode layer. A metal silicide layer 240 is then deposited in contact with the metal silicon nitride layer. A conductive metal bit line 250 is deposited in contact with the metal silicide layer, so that the conductive metal bit line is electrically connected to the plurality of memory cells. As described above, the phase change memory structure can also include additional layers such as additional electrode layers, diffusion barrier layers, select device material layers, and word line layers even though such layers are not shown in FIG. 2.

FIG. 2 also represents compressive stress 270 and tensile stress 280 as dashed arrows. As described above, compressive residual stress in the top electrode and/or metal silicon nitride layers can tend to compress the conductive metal bit line. This can cause the bit line to warp and bend. In some cases, the bit line can bend enough to touch a neighboring bit line, creating a bit line short. However, adding the metal silicide layer between the metal silicon nitride layer and the bit line can increase the tensile stress in the bit line, which can counteract the compressive stress in the underlying layers.

As described above, the tensile stress in the conductive metal bit line can be further controlled by adjusted parameters of the metal deposition process used to form the conductive metal bit line. In some cases, adjusting the parameters to increase the tensile stress can have the unwanted side effect of increasing the resistivity and roughness of the conductive metal bit line. By using a metal silicide layer between the metal silicon nitride layer and the conductive metal bit line as shown in FIG. 2, additional tensile stress can be added to the bit line without adjusting the metal deposition parameters in this way. Thus, the metal deposition process can have much more flexibility by way of selecting parameters to achieve lower resistivity and roughness while also having sufficient tensile stress in the bit line. In certain examples, the conductive metal bit line can have a resistivity of 5.6 μΩ-cm to 50 μΩ-cm. In further examples, the conductive metal bit line can have a resistivity of 8.9 μΩ-cm to 9.5 μΩ-cm. In additional examples, the conductive metal bit line can have a surface roughness of 2 Å to 200 Å.

Figure 3:
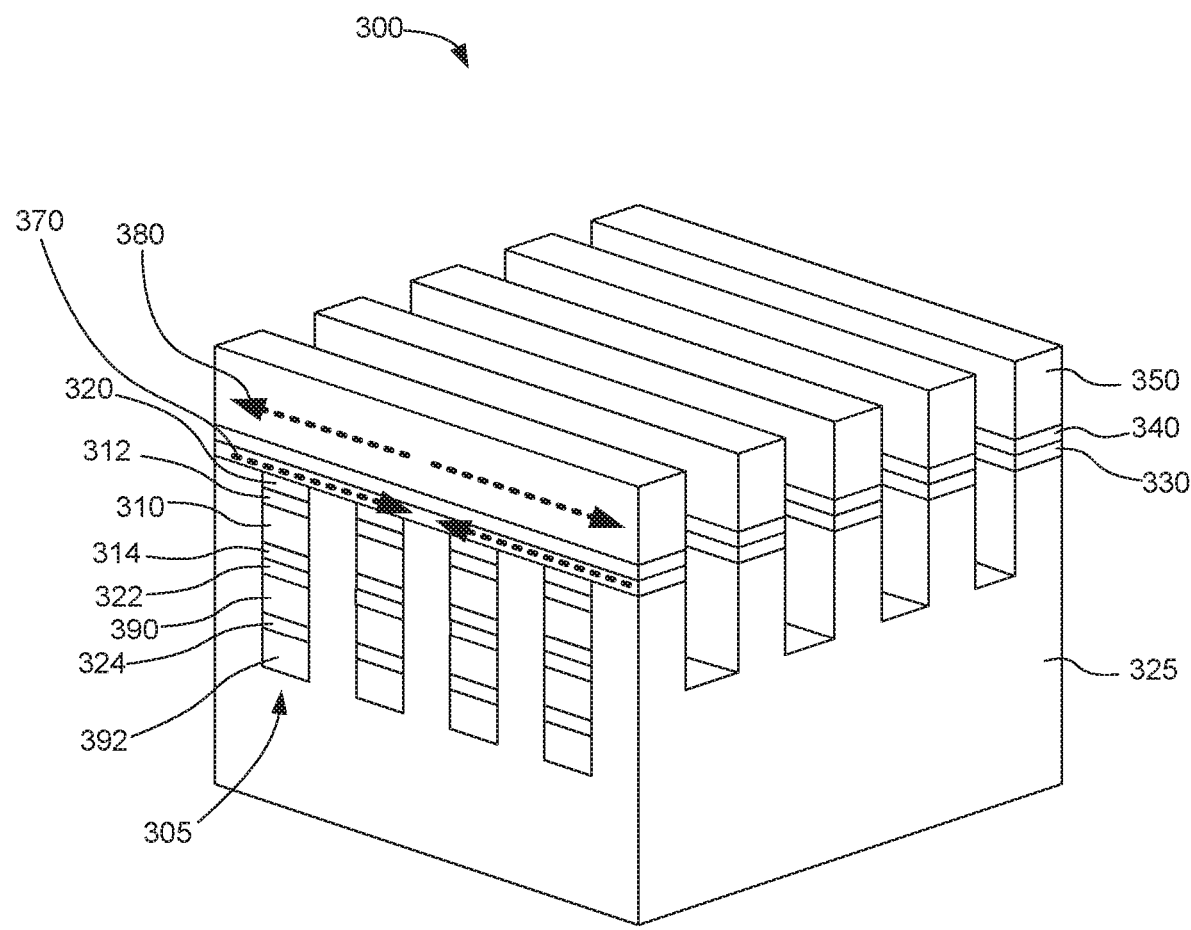
FIG. 3 is a perspective view of an example phase change memory structure in accordance with an example embodiment.

FIG. 3 shows a perspective view of another example phase change memory structure 300 in accordance with the present technology. This memory structure includes an array of memory cells 305 arranged in rows and columns. Each memory cell includes a phase change material layer 310 and a top electrode layer 320 above the phase change material layer. In this particular example, the memory cells also include a top diffusion barrier layer 312 between the phase change material layer and the top electrode layer, a bottom diffusion barrier layer 314, a middle electrode layer 322, a select device material layer 390, and a bottom electrode layer 324. A plurality of word lines 392 connect rows of memory cells together at the bottom of the memory cells. The memory cells in each column are separated one from another by a dielectric material 325.

In the example of FIG. 3, a plurality of metal silicon nitride layers 330 are deposited in contact with the top electrode layers of the memory cells. A plurality of metal silicide layers 340 are deposited over the metal silicon nitride layers. In this example, each column of memory cells has a continuous metal silicon nitride layer and metal silicide layer extending along the column. However, in other examples each individual memory cell can have its own metal silicide layer and metal silicon nitride layer. A plurality of conductive metal bit lines 350 are deposited over the metal silicide layers. Each conductive metal bit line is electrically connected to a column of memory cells. FIG. 3 also shows compressive stress 370 and tensile stress 380 as dashed arrows extending along the columns of memory cells. The metal silicide layer can increase the tensile stress in the conductive metal bit line to counteract compressive stress in the underlying layers.

The amount of tensile stress in the conductive metal bit line can be adjusted both by adding the metal silicide layer beneath the conductive metal bit and by adjusting parameters of the metal deposition process used for forming the conductive metal bit line. In some examples, the parameters of the metal deposition that can be used to adjust tensile stress can include substrate temperature, substrate bias, and deposition pressure. In further examples, the conductive metal bit line can have a tensile stress of 500 MPa to 3000 MPa. In other examples, the conductive metal bit line can have a tensile stress of 1000 MPa to 2500 MPa, or 1800 MPa to 2100 MPa.

Increasing the tensile stress of the conductive metal bit line can reduce bit line bending and warping. This can produce a measurable change in line width roughness and space width roughness. As used herein, "line width roughness" refers to a measure of the variation in line width of a bit line, defined as the quantitative measure of the irregularity (three standard deviations) of the width of a line or lines throughout the entire line length. Similarly, "space width roughness" refers to a measure of the variation in the width of spaces between neighboring bit lines, and is specifically defined as the quantitative measure of the irregularity (three standard deviations) of the width of the space between adjacent lines throughout their lengths. In some examples, the conductive metal bit lines can have a line width roughness of 2 Å to 200 Å. In further examples, the conductive metal bit lines can have a line width roughness of 18 Å to 22 Å. In some examples, the conductive metal bit lines can have a space width roughness of 5 Å to 200 Å. In still further examples, the conductive metal bit lines can have a space width roughness of 30 Å to 45 Å.

It should be noted that the figures described herein show examples of memory structures and arrays to illustrate features of the present technology, and that the present technology is not limited by the number of memory cells, size of arrays, dimensions of material layers, etc., as shown in the figures. In many practical applications, phase change memory structures and systems in accordance with the present technology can have many more memory cells than are depicted in the figures. For example, phase change memory structures and systems can have millions, billions, or more memory cells compared to the relatively small number depicted in the figures.

As mentioned above, bit lines can be oriented along columns of memory cells and word lines can be oriented along rows of memory cells. In many embodiments described herein, the bit lines are described as being deposited on the top of the memory cells while the word lines are described as being at the bottom of the memory cells. However, in other embodiments, the word lines can be at the top of the memory cells and the bit lines can be at the bottom of the memory cells. Additionally, because designation of "rows" and "columns" of memory cells can be arbitrary, in many cases the terms "bit line" and "word line" can be interchangeable and merely describe which electrically conductive line is oriented in the row direction and which is oriented in the column direction. Thus, embodiments that are described as having bit lines on top of the memory cells can also encompass devices having word lines on the top. Similarly, embodiments described as having word lines on the bottom of the memory cells can also encompass devices having bit lines on the bottom.

Figure 4:
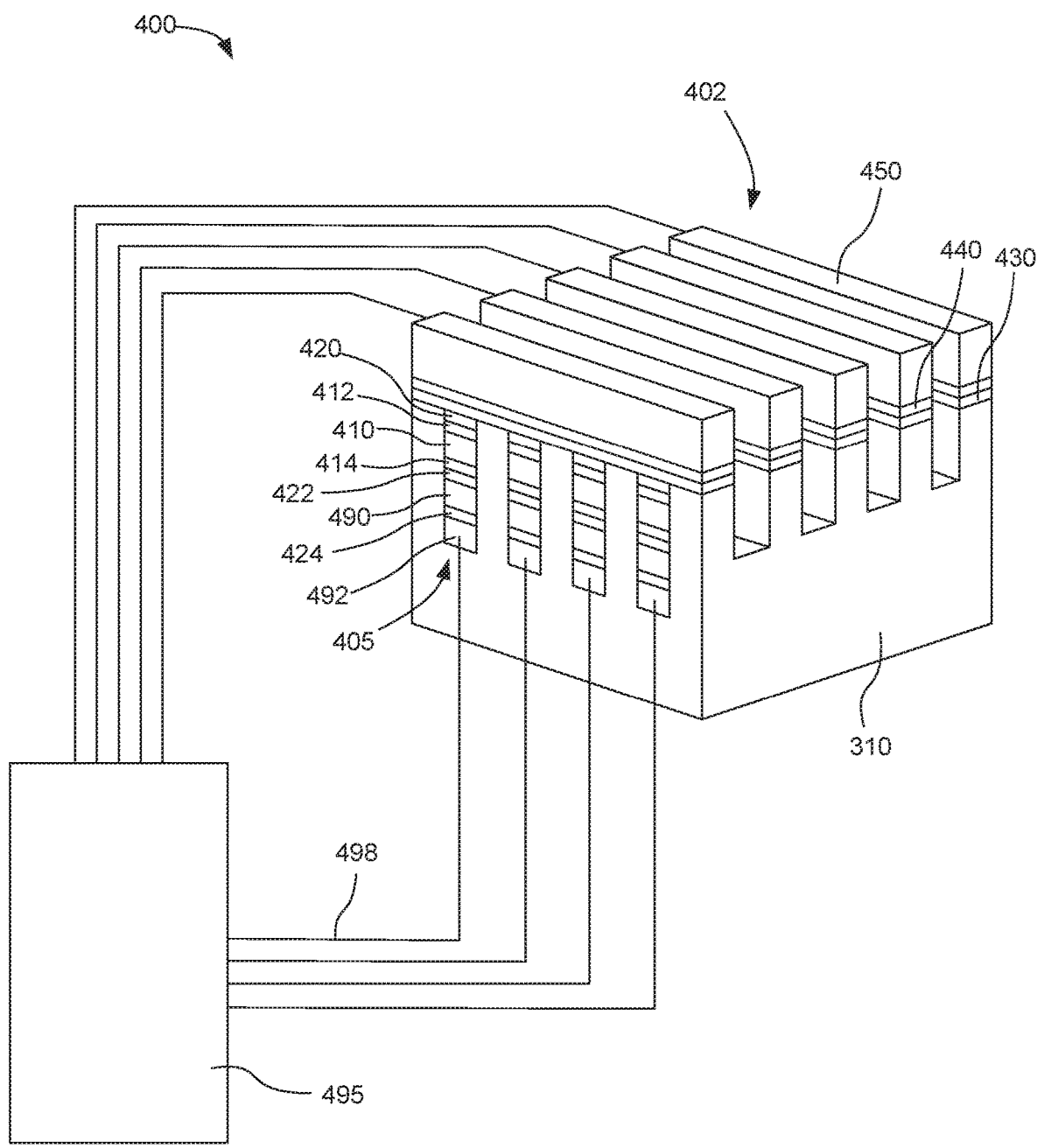
FIG. 4 is a schematic of an example phase change memory system in accordance with an example embodiment.

The presently disclosed technology also extends to phase change memory systems. FIG. 4 shows a schematic of an example phase change memory system 400 in accordance with the present technology. The system includes an array 402 of memory cells 405. The memory cells include a phase change material layer 410 and a top electrode layer 420. In this particular example, the memory cells also include a top diffusion barrier layer 412 between the phase change material layer and the top electrode layer, a bottom diffusion barrier layer 414, a middle electrode layer 422, a select device material layer 490, and a bottom electrode layer 424. A plurality of word lines 492 connect rows of memory cells together at the bottom of the memory cells. The memory cells in each column are separated one from another by a dielectric material 425. A plurality of metal silicon nitride layers 430 are deposited in contact with the top electrode layers of the memory cells. A plurality of metal silicide layers 440 are deposited over the metal silicon nitride layers. A plurality of conductive metal bit lines 450 are deposited over the metal silicide layers. Each conductive metal bit line is electrically connected to a column of memory cells.

A read/write controller 495 is electrically coupled to the plurality of word lines and plurality of conductive metal bit lines through electrical connections 498. The read/write controller can be operable to perform read and write operations to and from the array of memory cells via the plurality of word lines and the plurality of conductive metal bit lines.

In various examples, the system can also include any number of user interfaces, display devices, as well as various other components that would be beneficial for such a system.

In further examples, the system can also include additional memory that can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The system can additionally include a local communication interface for connectivity between the various components of the system.

Further, the system can include an input/output (I/O) interface for controlling the I/O functions of the system, as well as for I/O connectivity to devices outside of the system. A network interface can also be included for network connectivity, either as a separate interface or as part of the I/O interface. The network interface can control network communications both within the system and outside of the system. The network interface can include a wired interface, a wireless interface, a Bluetooth interface, optical interface, and the like, including appropriate combinations thereof.

Phase change memory structures and systems as described herein can be incorporated into a wide variety of devices. While any type or configuration of device or computing system is contemplated to be within the present scope, non-limiting examples can include laptop computers, tablet computers, smart phones, CPU systems, SoC systems, server systems, networking systems, storage systems, high capacity memory systems, or any other computational system.

Figure 5:
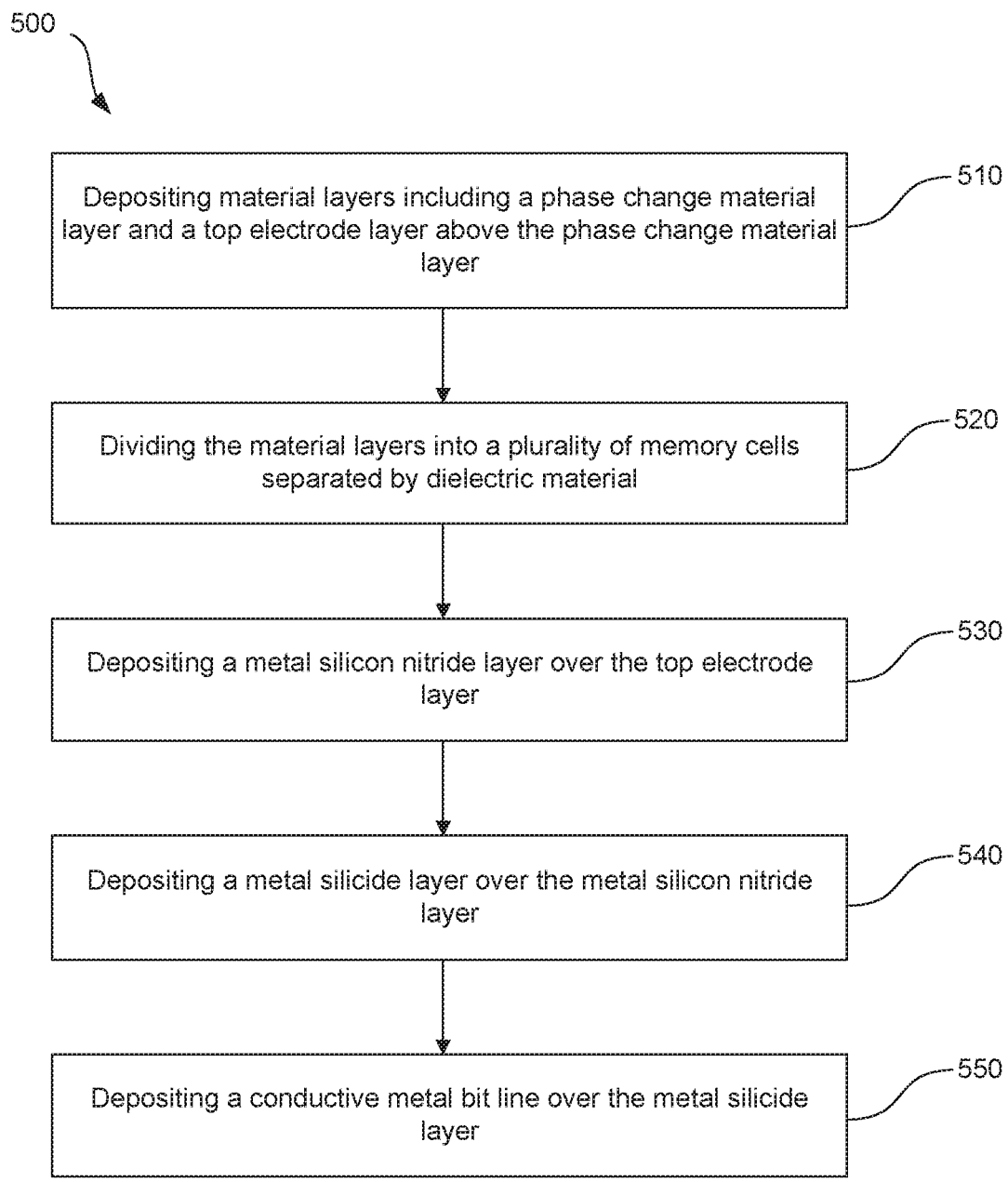
FIG. 5 is a flowchart of an example method of making a phase change memory structure in accordance with an example embodiment.

The present technology also extends to methods of making a phase change memory structure. FIG. 5 is a flowchart of an example method 500 of making a phase change memory structure. The method includes: depositing material layers including a phase change material layer and a top electrode layer above the phase change material layer 510; dividing the material layers into a plurality of memory cells separated by dielectric material 520; depositing a metal silicon nitride layer over the top electrode layer 530; depositing a metal silicide layer over the metal silicon nitride layer 540; and depositing a conductive metal bit line over the metal silicide layer 550.

EXAMPLES

The following examples pertain to specific embodiments and point out specific features, elements, or steps that can be used or otherwise combined in achieving such embodiments.

Figure 6:
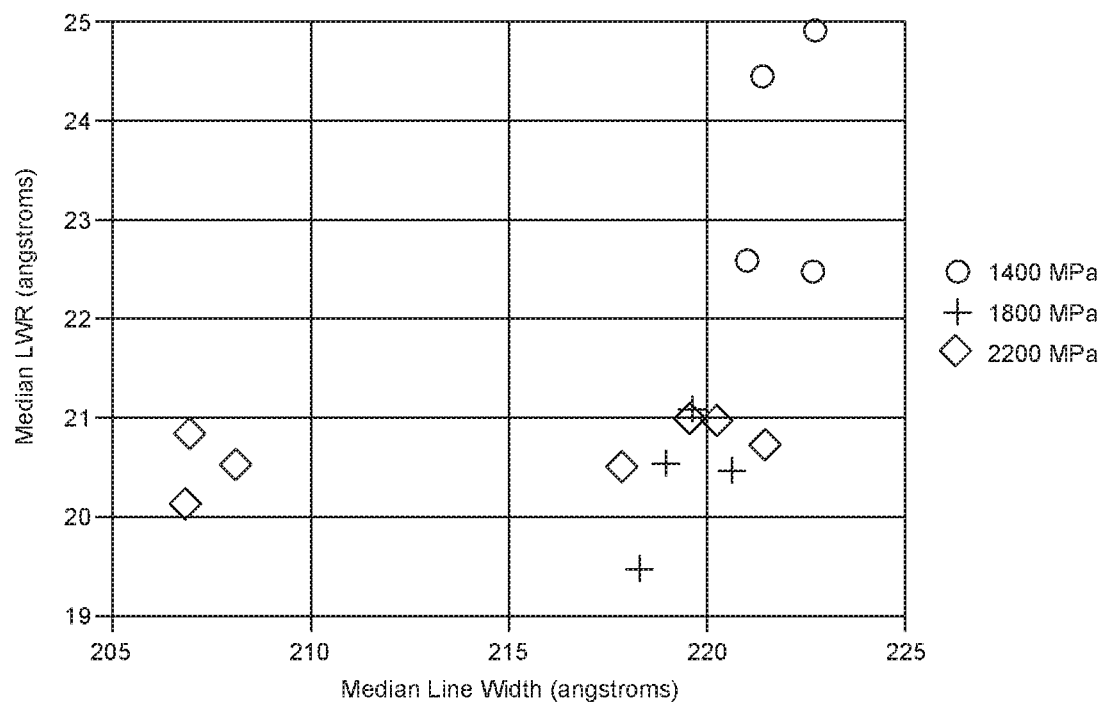
FIG. 6 is a plot of line width roughness vs. line width for tungsten bit lines formed with several different amounts of tensile stress.
Figure 7:
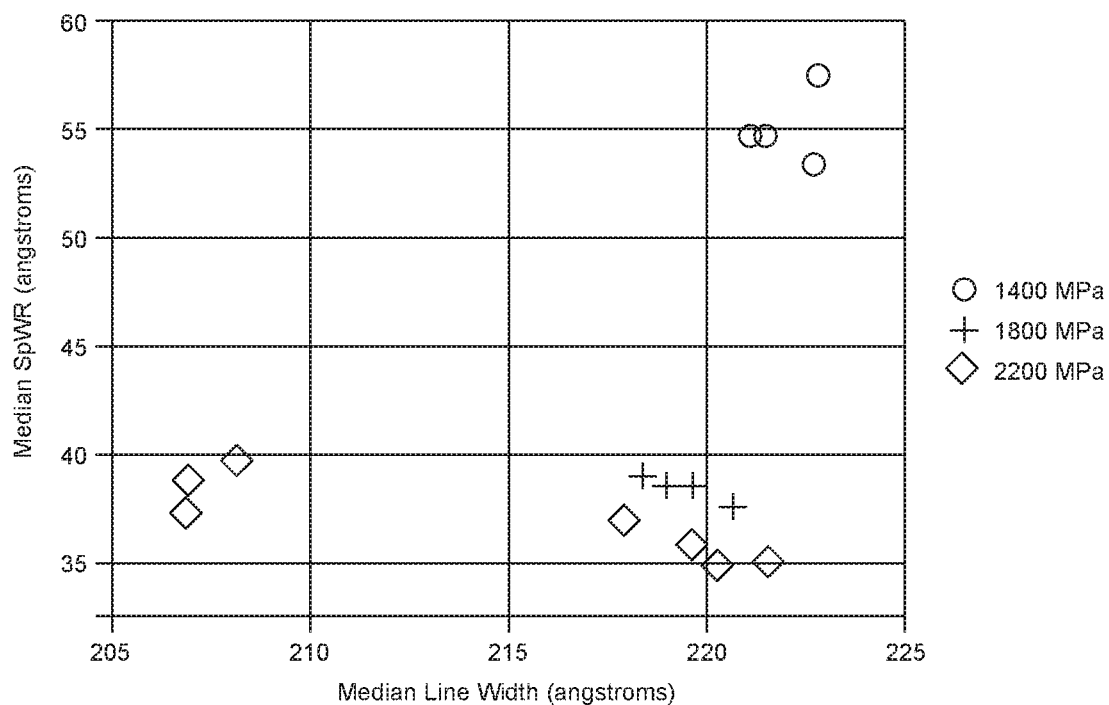
FIG. 7 is a plot of space width roughness vs. line width for tungsten bit lines formed with several different amounts of tensile stress.

To explore the relationships between tensile stress in bit lines and the line width roughness, space width roughness, and resistivity of the bit lines, several experiments were performed with tungsten bit lines. In one example, a series of phase change memory structures were formed with tungsten bit lines having a tensile stress of 1400 MPa, 1800 MPa, and 2200 MPa. In this test, the tungsten bit lines were deposited directly onto tungsten silicon nitride layers, without an intermediate tungsten silicide layer. The line width roughness and space width roughness of the bit lines were then measured. The results are shown in FIGS. 6 and 7. As evident from the figures, increasing the tensile stress of the tungsten bit lines to 1800 MPa or 2200 MPa produced lower line width roughness and space width roughness, indicating that the bit lines have less bending.

Figure 8:
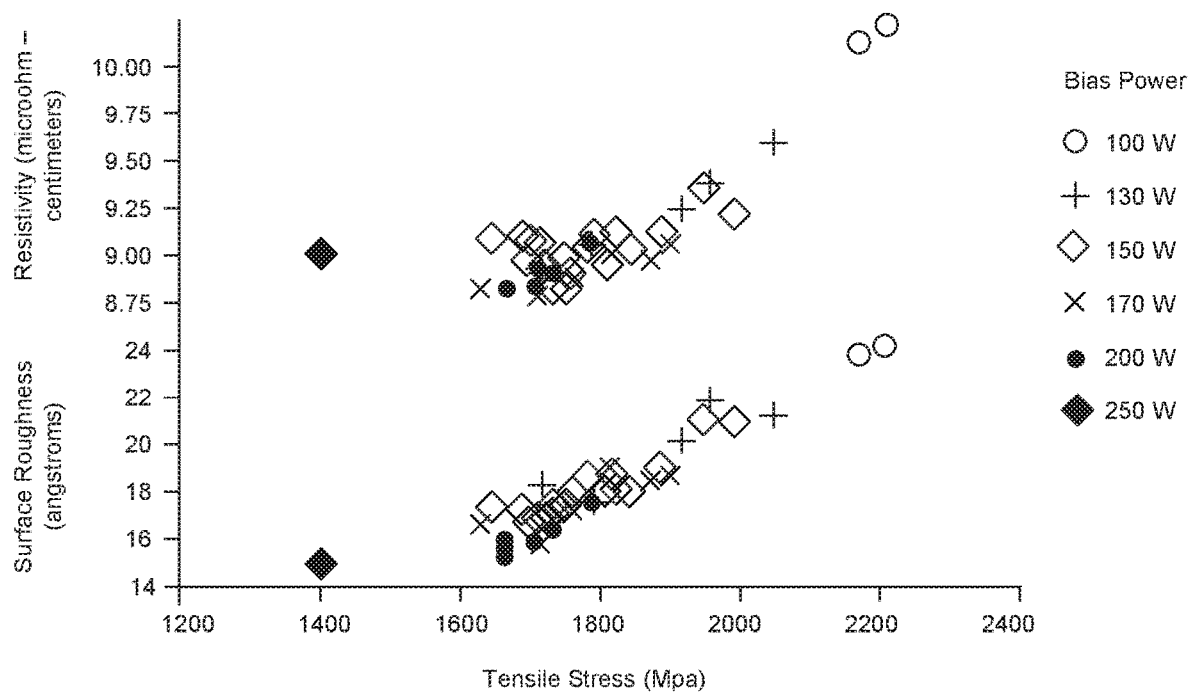
FIG. 8 is a plot of resistivity and surface roughness vs. tensile stress for tungsten bit lines formed using several different bias powers.

Another series of phase change memory structures were formed using varying bias powers during the tungsten deposition process. The tungsten bit lines were deposited directly onto tungsten silicon nitride layers, without any intermediate tungsten silicide layers. The resulting tungsten bit lines had a range of tensile stress from about 1400 MPa to about 2200 MPa. The surface roughness and resistivity of these tungsten bit lines are plotted in FIG. 8. As evident from this figure, the surface roughness and resistivity tend to increase as the tensile stress of the tungsten bit lines increases.

Figure 9:
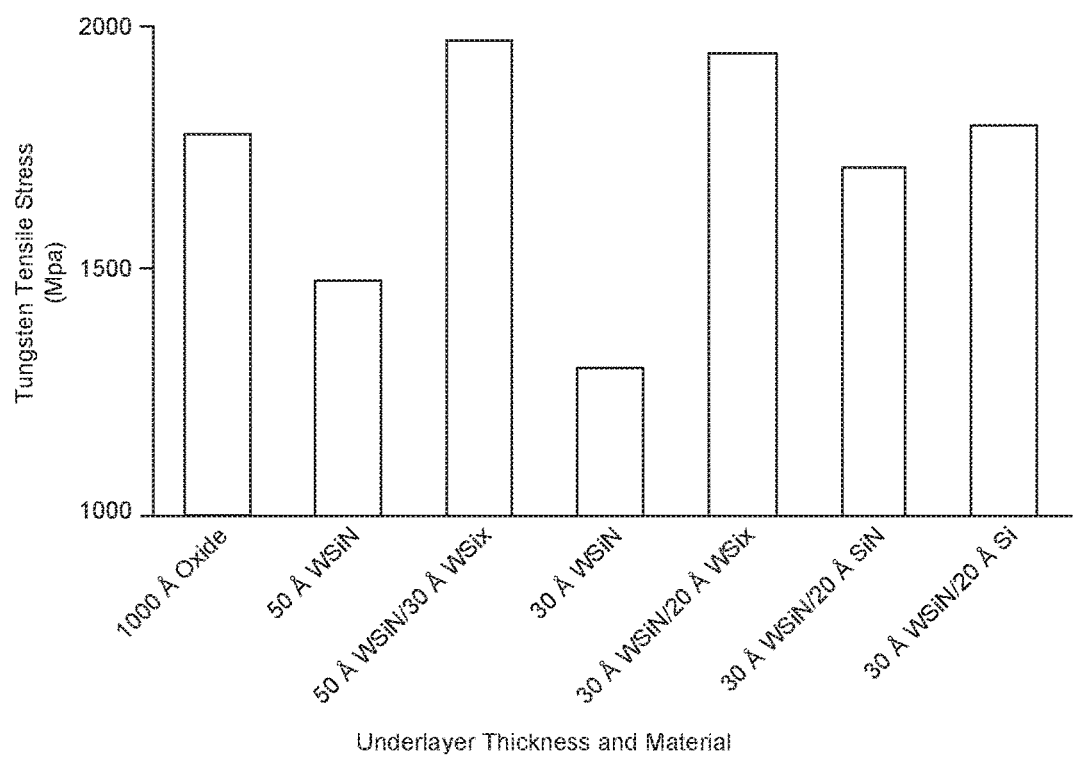
FIG. 9 is a chart of tensile stress for tungsten bit lines formed over several different underlayer types.

In another experiment, several types of intermediate layers were tested between the tungsten silicon nitride layer and the tungsten bit lines. Tungsten bit lines were deposited using identical deposition parameters, but with differing underlayers under the tungsten bit lines. The tensile stress in the tungsten bit lines was then measured. The tensile stress for tungsten bit lines deposited over each type of underlayer is shown in FIG. 9. The tungsten bit lines formed over a $WSi_x$ layer had the most tensile stress out of the underlayer types tested.

The resistivity of the tungsten bit lines formed over a $WSi_x$ layer was compared to tungsten bit lines formed over silicon oxide and tungsten bit lines formed over WSiN. The tungsten bit lines formed over silicon oxide had a resistivity of 8.9 µΩ-cm; the tungsten bit lines formed over WSiN had a resistivity of 9.7 µΩ-cm; and the tungsten bit lines formed over $WSi_x$ had a resistivity of 9.4 µΩ-cm. Thus, the $WSi_x$ appears to have reduced the resistivity of the tungsten bit lines compared to WSiN.

In one exemplary embodiment, a phase change memory structure is provided. The phase change memory structure includes a phase change material layer, a top electrode layer above the phase change material layer, a metal silicon nitride layer in contact with the top electrode layer opposite from the phase change material layer, a metal silicide layer in contact with the metal silicon nitride layer opposite from the top electrode layer, and a conductive metal bit line in contact with the metal silicide layer opposite from the metal silicon nitride layer.

In a certain example, the metal silicon nitride layer, metal silicide layer, and conductive metal bit line include tungsten, tantalum, niobium, molybdenum, titanium, or a combination thereof.

In another particular example, the metal silicon nitride layer is formed of tungsten silicon nitride, the metal silicide layer is formed of tungsten silicide, and the conductive metal bit line is formed of tungsten.

In another example, the conductive metal bit line has a thickness of 100 Å to 1000 Å.

In one example, the conductive metal bit line has a tensile stress of 500 MPa to 3000 MPa.

In another example, the conductive metal bit line has a line width roughness of 2 Å to 200 Å.

In a further example, the conductive metal bit line has a surface roughness of 2 Å to 200 Å.

In yet another example, the conductive metal bit line has a resistivity of 5.6 μΩ-cm to 50 μΩ-cm.

In an example, the metal silicide layer has a thickness of 10 Å to 300 Å.

In a further example, the metal silicide layer includes tungsten silicide, tantalum silicide, niobium silicide, molybdenum silicide, titanium silicide, or a combination thereof.

In a particular example, the metal silicide layer includes tungsten silicide having a general formula of $WSi_X$ where x is from 1 to 3.

In one example, the metal silicon nitride layer has a thickness of 10 Å to 300 Å.

In another example, the metal silicon nitride layer includes tungsten silicon nitride, tantalum silicon nitride, niobium silicon nitride, molybdenum silicon nitride, titanium silicon nitride, or a combination thereof.

In a further example, the top electrode layer includes a carbon-containing material.

In another example, the top electrode layer has a thickness of 10 Å to 500 Å.

In another exemplary embodiment, a phase change memory structure is provided. The phase change memory structure includes: a plurality of memory cells including a phase change material layer and a top electrode layer above the phase change material layer; dielectric material electrically insulating the memory cells one from another; a metal silicon nitride layer in contact with the top electrode layer of the plurality of memory cells; a metal silicide layer in contact with the metal silicon nitride layer; and a conductive metal bit line in contact with the metal silicide layer. The conductive metal bit line is electrically connected to the plurality of memory cells.

In a further example, the metal silicon nitride layer, metal silicide layer, and conductive metal bit line include tungsten, tantalum, niobium, molybdenum, titanium, or a combination thereof.

In a still further example, the metal silicon nitride layer is formed of tungsten silicon nitride, the metal silicide layer is formed of tungsten silicide, and the conductive metal bit line is formed of tungsten.

In another example, the metal silicon nitride layer, metal silicide layer, and conductive metal bit line are continuous layers extending along the plurality of memory cells.

In a further example, the conductive metal bit line has a thickness of 100 Å to 1000 Å.

In another example, the conductive metal bit line has a tensile stress of 500 MPa to 3000 MPa.

In still another example, the conductive metal bit line has a line width roughness of 2 Å to 200 Å.

In another example, the conductive metal bit line has a surface roughness of 2 Å to 200 Å.

In yet another example, the conductive metal bit line has a resistivity of 5.6 μΩ-cm to 50 μΩ-cm.

In one example, the metal silicide layer has a thickness of 10 Å to 300 Å.

In a further example, the metal silicide layer includes tungsten silicide, tantalum silicide, niobium silicide, molybdenum silicide, titanium silicide, or a combination thereof.

In a particular example, the metal silicide layer includes tungsten silicide having a general formula of $WSi_X$ where x is from 1 to 3.

In another example, the metal silicon nitride layer has a thickness of 10 Å to 300 Å.

In yet another example, the top electrode layer includes a carbon-containing material.

In a further example, the top electrode layer has a thickness of 10 Å to 500 Å.

In another exemplary embodiment, a phase change memory structure is provided. The phase change memory structure includes: an array of memory cells arranged in rows and columns, wherein the memory cells include a phase change material layer and a top electrode layer above the phase change material layer; a dielectric material electrically insulating the memory cells one from another; a plurality of metal silicon nitride layers in contact with the top electrode layer of the plurality of memory cells; a plurality of metal silicide layers in contact with the plurality of metal silicon nitride layers; and a plurality of conductive metal bit lines in contact with the plurality of metal silicide layers. The conductive metal bit lines extend along the columns to electrically connect each bit line to a column of memory cells.

In one example, the metal silicon nitride layer, metal silicide layer, and conductive metal bit line include tungsten, tantalum, niobium, molybdenum, titanium, or a combination thereof.

In a further example, the metal silicon nitride layer is formed of tungsten silicon nitride, the metal silicide layer is formed of tungsten silicide, and the conductive metal bit line is formed of tungsten.

In a still further example, the metal silicon nitride layer and the metal silicide layer are continuous layers extending along the columns to electrically connect each metal silicon nitride layer and metal silicide layer to a column of memory cells.

In a further example, the conductive metal bit lines have a thickness of 100 Å to 1000 Å.

In a still further example, the conductive metal bit lines have a tensile stress of 500 MPa to 3000 MPa.

In yet another example, the conductive metal bit lines have a line width roughness of 2 Å to 200 Å.

In another example, the conductive metal bit lines have a surface roughness of 2 Å to 200 Å.

In a further example, the conductive metal bit lines have a space width roughness of 5 Å to 200 Å.

In yet another example, the conductive metal bit lines have a resistivity of 5.6 μΩ-cm to 50 μΩ-cm.

In one example, the metal silicide layers have a thickness of 10 Å to 300 Å.

In a further example, the metal silicide layers include tungsten silicide, tantalum silicide, niobium silicide, molybdenum silicide, titanium silicide, or a combination thereof.

In a particular example, the metal silicide layers include tungsten silicide having a general formula of $WSi_X$ where x is from 1 to 3.

In another example, the metal silicon nitride layers have a thickness of 10 Å to 100 Å.

In a further example, the metal silicon nitride layers include tungsten silicon nitride, tantalum silicon nitride, niobium silicon nitride, molybdenum silicon nitride, titanium silicon nitride, or a combination thereof.

In another example, the top electrode layers include a carbon-containing material.

In yet another example, the top electrode layers have a thickness of 10 Å to 500 Å.

In another exemplary embodiment, a phase change memory system is provided. The system includes: an array of memory cells arranged in rows and columns, wherein the memory cells include a phase change material layer and a top electrode layer above the phase change material layer; a dielectric material electrically insulating the memory cells one from another; a plurality of metal silicon nitride layers in contact with the top electrode layer of the plurality of memory cells; a plurality of metal silicide layers in contact with the plurality of metal silicon nitride layers; a plurality of conductive metal bit lines in contact with the plurality of metal silicon nitride layers, wherein the conductive metal bit lines extend along the columns to electrically connect each bit line to a column of memory cells; a plurality of word lines in contact with a bottom surface of the memory cells, wherein the word lines extend along the rows to electrically connect each word line to a row of memory cells; and a read/write controller electrically coupled to the plurality of word lines and the plurality of conductive metal bit lines, the read/write controller being operable to perform read and write operations to and from the array of memory cells via the plurality of word lines and the plurality of conductive metal bit lines.

In one example, the metal silicon nitride layers, metal silicide layers, and conductive metal bit lines include tungsten, tantalum, niobium, molybdenum, titanium, or a combination thereof.

In another example, the metal silicon nitride layers are formed of tungsten silicon nitride, the metal silicide layers are formed of tungsten silicide, and the conductive metal bit lines are formed of tungsten.

In a further example, the metal silicon nitride layers and the metal silicide layers are continuous layers extending along the columns to electrically connect each metal silicon nitride layer and metal silicide layer to a column of memory cells.

In another example, the conductive metal bit lines have a thickness of 100 Å to 1000 Å.

In a further example, the conductive metal bit lines have a tensile stress of 500 MPa to 3000 MPa.

In a still further example, the conductive metal bit lines have a line width roughness of 2 Å to 200 Å.

In yet another example, the conductive metal bit lines have a surface roughness of 2 Å to 200 Å.

In another example, the conductive metal bit lines have a space width roughness of 5 Å to 200 Å.

In a further example, the conductive metal bit lines have a resistivity of 5.6 μΩ-cm to 50 μΩ-cm.

In one example, the metal silicide layers have a thickness of 10 Å to 300 Å.

In another example, the metal silicide layers include tungsten silicide, tantalum silicide, niobium silicide, molybdenum silicide, titanium silicide, or a combination thereof.

In yet another example, the metal silicide layers include tungsten silicide having a general formula of $WSi_x$ where x is from 1 to 3.

In a further example, the metal silicon nitride layers have a thickness of 10 Å to 300 Å.

In yet another example, the metal silicon nitride layers include tungsten silicon nitride, tantalum silicon nitride, niobium silicon nitride, molybdenum silicon nitride, titanium silicon nitride, or a combination thereof.

In another example, the top electrode layers include a carbon-containing material.

In a further example, the top electrode layers have a thickness of 10 Å to 500 Å.

In another exemplary embodiment, a method of making a phase change memory structure is provided. The method includes: depositing material layers including a phase change material layer and a top electrode layer above the phase change material layer; dividing the material layers into a plurality of memory cells separated by dielectric material; depositing a metal silicon nitride layer over the top electrode layer; depositing a metal silicide layer over the metal silicon nitride layer; and depositing a conductive metal bit line over the metal silicide layer.

In a further example, depositing the conductive metal bit line includes depositing with a bias power and deposition pressure sufficient to provide a conductive metal bit line having a resistivity of 5.6 μΩ-cm to 50 μΩ-cm.

While the forgoing examples are illustrative of the principles of embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A phase change memory structure, comprising:
   a phase change material layer;
   a top electrode layer above the phase change material layer;
   a metal silicon nitride layer in contact with the top electrode layer opposite from the phase change material layer;
   a metal silicide layer in contact with the metal silicon nitride layer opposite from the top electrode layer; and
   a conductive metal bit line in contact with the metal silicide layer opposite from the metal silicon nitride layer.

2. The memory structure of claim 1, wherein the metal silicon nitride layer, metal silicide layer, and conductive metal bit line comprise tungsten, tantalum, niobium, molybdenum, titanium, or a combination thereof.

3. The memory structure of claim 1, wherein the metal silicon nitride layer is formed of tungsten silicon nitride, wherein the metal silicide layer is formed of tungsten silicide, and wherein the conductive metal bit line is formed of tungsten.

4. The memory structure of claim 1, wherein the conductive metal bit line has a thickness of 100 Å to 1000 Å.

5. The memory structure of claim 1, wherein the conductive metal bit line has a tensile stress of 500 MPa to 3000 MPa.

6. The memory structure of claim 1, wherein the conductive metal bit line has a line width roughness of 2 Å to 200 Å.

7. The memory structure of claim 1, wherein the conductive metal bit line has a surface roughness of 2 Å to 200 Å.

8. The memory structure of claim 1, wherein the conductive metal bit line has a resistivity of 5.6 μΩ-cm to 50 μΩ-cm.

9. The memory structure of claim 1, wherein the metal silicide layer has a thickness of 10 Å to 300 Å.

10. The memory structure of claim 1, wherein the metal silicide layer comprises tungsten silicide, tantalum silicide, niobium silicide, molybdenum silicide, titanium silicide, or a combination thereof.

11. The memory structure of claim 1, wherein the metal silicide layer comprises tungsten silicide having a general formula of $WSi_x$ where x is from 1 to 3.

12. The memory structure of claim 1, wherein the metal silicon nitride layer has a thickness of 10 Å to 300 Å.

13. The memory structure of claim 1, wherein the metal silicon nitride layer comprises tungsten silicon nitride, tantalum silicon nitride, niobium silicon nitride, molybdenum silicon nitride, titanium silicon nitride, or a combination thereof.

14. The memory structure of claim 1, wherein the top electrode layer comprises a carbon-containing material.

15. The memory structure of claim 1, wherein the top electrode layer has a thickness of 10 Å to 500 Å.

16. A phase change memory system, comprising:
   an array of memory cells arranged in rows and columns, wherein the memory cells comprise a phase change material layer and a top electrode layer above the phase change material layer;
   a dielectric material electrically insulating the memory cells one from another;
   a plurality of metal silicon nitride layers in contact with the top electrode layer of the plurality of memory cells;
   a plurality of metal silicide layers in contact with the plurality of metal silicon nitride layers;
   a plurality of conductive metal bit lines in contact with the plurality of metal silicide layers, wherein the conductive metal bit lines extend along the columns to electrically connect each bit line to a column of memory cells;
   a plurality of word lines in contact with a bottom surface of the memory cells, wherein the word lines extend along the rows to electrically connect each word line to a row of memory cells; and
   a read/write controller electrically coupled to the plurality of word lines and the plurality of conductive metal bit lines, the read/write controller being operable to perform read and write operations to and from the array of memory cells via the plurality of word lines and the plurality of conductive metal bit lines.

17. The system of claim 16, wherein the metal silicon nitride layers, metal silicide layers, and conductive metal bit lines comprise tungsten, tantalum, niobium, molybdenum, titanium, or a combination thereof.

18. The memory structure of claim 16, wherein the metal silicon nitride layers are formed of tungsten silicon nitride, wherein the metal silicide layers are formed of tungsten silicide, and wherein the conductive metal bit lines are formed of tungsten.

19. The system of claim 16, wherein the metal silicon nitride layers and the metal silicide layers are continuous layers extending along the columns to electrically connect each metal silicon nitride layer and metal silicide layer to a column of memory cells.

20. The system of claim 16, wherein the metal silicide layers comprise tungsten silicide, tantalum silicide, niobium silicide, molybdenum silicide, titanium silicide, or a combination thereof.

21. The system of claim 16, wherein the metal silicide layers comprise tungsten silicide having a general formula of $WSi_x$ where x is from 1 to 3.

22. The system of claim 16, wherein the metal silicon nitride layers comprise tungsten silicon nitride, tantalum silicon nitride, niobium silicon nitride, molybdenum silicon nitride, titanium silicon nitride, or a combination thereof.

23. The system of claim 16, wherein the top electrode layers comprise a carbon-containing material.

24. A method of making a phase change memory structure, comprising:
   depositing material layers including a phase change material layer and a top electrode layer above the phase change material layer;
   dividing the material layers into a plurality of memory cells separated by dielectric material;
   depositing a metal silicon nitride layer over the top electrode layer;
   depositing a metal silicide layer over the metal silicon nitride layer; and
   depositing a conductive metal bit line over the metal silicide layer.

25. The method of claim 24, wherein depositing the conductive metal bit line comprises depositing with a bias power and deposition pressure sufficient to provide a conductive metal bit line having a resistivity of 5.6 µΩ-cm to 50 µΩ-cm.

* * * * *